US 6,390,181 B1

United States Patent
Hall et al.

(10) Patent No.: US 6,390,181 B1
(45) Date of Patent: May 21, 2002

(54) DENSELY FINNED TUNGSTEN CARBIDE AND POLYCRYSTALLINE DIAMOND COOLING MODULE

(76) Inventors: David R. Hall; Joe Fox, both of 2185 S. Larsen Pkwy., Provo, UT (US) 84606

( * ) Notice: Subject to any disclaimer, the term of this patent is extended or adjusted under 35 U.S.C. 154(b) by 0 days.

(21) Appl. No.: 09/677,666

(22) Filed: Oct. 4, 2000

(51) Int. Cl.[7] .................................................. H05K 7/20
(52) U.S. Cl. ..................... 165/80.3; 165/185; 165/905; 361/704; 257/722
(58) Field of Search ................................ 165/80.3, 185, 165/905; 361/704, 710; 257/719, 722; 174/16.3

(56) References Cited

U.S. PATENT DOCUMENTS

| | | | | |
|---|---|---|---|---|
| 4,541,004 A | * | 9/1985 | Moore ......................... | 257/719 |
| 5,162,974 A | * | 11/1992 | Currie ......................... | 361/385 |
| 5,285,347 A | * | 2/1994 | Fox et al. .................... | 361/385 |
| 5,291,064 A | * | 3/1994 | Kurokawa ................... | 257/714 |
| 5,642,779 A | * | 7/1997 | Yamamoto et al. ......... | 165/185 |
| 5,786,075 A | * | 7/1998 | Mishuku et al. ............ | 428/325 |
| 5,981,310 A | * | 11/1999 | DiGiacomo et al. ........ | 438/106 |
| 6,101,715 A | * | 8/2000 | Fuesser et al. ........... | 29/890.03 |
| 6,202,771 B1 | * | 3/2001 | Scott et al. .................. | 175/432 |

FOREIGN PATENT DOCUMENTS

JP       11-163231 A   *   6/1999 ........... H01L/23/36

OTHER PUBLICATIONS

Abi–Nader et al., "High Performance Ceramics", Fall 1998, American University in Cairo term project, located on the internet at: http://biotsavart.tripod.com//327.htm.*

* cited by examiner

Primary Examiner—Allen Flanigan

(57) ABSTRACT

An actively cooled, heat-dissipating module is presented for dissipating thermal energy from a heat producing integrated circuit device. The heat-dissipating module features a tungsten carbide body having high-density fins and a base with an interfacial surface adapted for attachment to an IC device. The base may also be bonded at high-pressure and high-temperature to a sintered polycrystalline diamond buffer element that, in turn, features a metalized interfacial surface suitable for attachment to the device. The high-density fins present a combined surface area at least 20 times greater than the surface area of the interfacial surface of the buffer element or the base of the heat-dissipating module. The tungsten carbide fins are capable of withstanding high flow and high velocity fluid environments. The high surface area of the fins optimizes the convective transfer of thermal energy from the fins to the high flow of cooling fluid. By bonding the module adjacent to the IC device, the number of thermal junctions is reduced, and the efficiency of the junctions is increased.

14 Claims, 4 Drawing Sheets

DENSELY FINNED TUNGSTEN CARBIDE AND POLYCRYSTALLINE DIAMOND COOLING MODULE

RELATED APPLICATIONS

None

BACKGROUND OF THE INVENTION

This invention relates to a tungsten carbide and polycrystalline diamond, densely finned, heat dissipating module adapted for direct attachment to an integrated circuit heat producing device. More particularly, this invention relates to a module that reduces the number, and increases the efficiency, of the thermal junctions between the IC device and a cooling fluid in an actively cooled thermal management system. This is achieved by using the stiffness and thermal properties of a micro finned tungsten carbide body integrally bonded to a polycrystalline diamond buffer element that has an interfacial surface suitable for intimate attachment directly to the IC device.

High-speed integrated circuits in modern and future electronic applications demand more efficient cooling of the heat producing IC devices. Numerous attempts have been made to meet this demand as evidenced by the hundreds of patents issued over the past 20 years in this field. Although thermal management systems have been adequate in past applications, IC manufacturers looking to the future have begun to design and build circuits that exceed the limits of current thermal solutions as heat densities exceed 200,000 W/m$^2$, or greater than the heat density of the sun's surface.

Those skilled in the art are referred to the following patents that present four general categories of proposed solutions to the growing need for an efficient thermal management system in IC applications.

U.S. Pat. No. 5,455,382, incorporated herein by this reference, teaches the use of thin parallel plates formed by means of a multi-wire saw as means for producing a finned heat sink. The thin plates increase the convective surface area of the heat sink thereby increasing the efficiency of the convection into the surrounding atmosphere.

U.S. Pat. No. 5,455,457, incorporated herein by this reference, teaches the use of a heat diffusing plate attached to the IC device by means of a pliable electrically insulating resin layer. The plate is intended to shorten the path of heat conduction between the heat source and the finned heat sink. A metal cap is also used over the package in order to seal out contaminants.

U.S. Pat. No. 57,860,785, incorporated herein by this reference, teaches the use of a composite material as a heat sink. The composite consists of a combination of diamond power and cemented carbide particles sintered together.

U.S. Pat. No. 5,791,045, incorporated herein by this reference, teaches the use of fins coated with diamond by the chemical vapor deposition method.

What is needed is a cooling module that is tough, has high thermal conductivity, has high density micro fins for efficient convection into a cooling fluid, and has coefficient of thermal expansion compatible with the IC device so that it can be intimately attached to the IC device. A cooling module composed of tungsten carbide and diamond meets this need.

SUMMARY OF THE INVENTION

This invention presents a cooling module comprising tungsten carbide high-density micro fins integrally bonded to a polycrystalline diamond buffer element. The buffer element portion of the module features an interfacial surface suitable for direct attachment to a high heat producing integrated circuit device, such as a packaged silicon or silicon carbide semiconductor element. The thin, high-density fins are capable of withstanding the dynamics associated with thermal cycling of the IC device and the pressures and flows of a convective cooling fluid in an actively cooled thermal management system. The combination of tungsten carbide and polycrystalline diamond by the high-temperature high-pressure sintering method produces a module having a coefficient of thermal expansion compatible with that of the silicon element. The diamond buffer may be provided with a smooth, flat metalized surface for direct bonding to the device. The use of the polycrystalline diamond adjacent the device insures that the integrity of the bond will not be compromised due to differences in linear expansion during thermal cycling. Intimately bonding of the thermal module directly to the device reduces the number of thermal junctions and results in a direct thermal path between the semiconductor element and the convective cooling fluid circulated across the micro fins. Moreover, direct bonding of the module to the heat-producing element increases the convective efficiency of the cooling fluid, thereby permitting the semiconductor element to run faster.

DETAILED DESCRIPTION OF THE INVENTION

Figure 2:
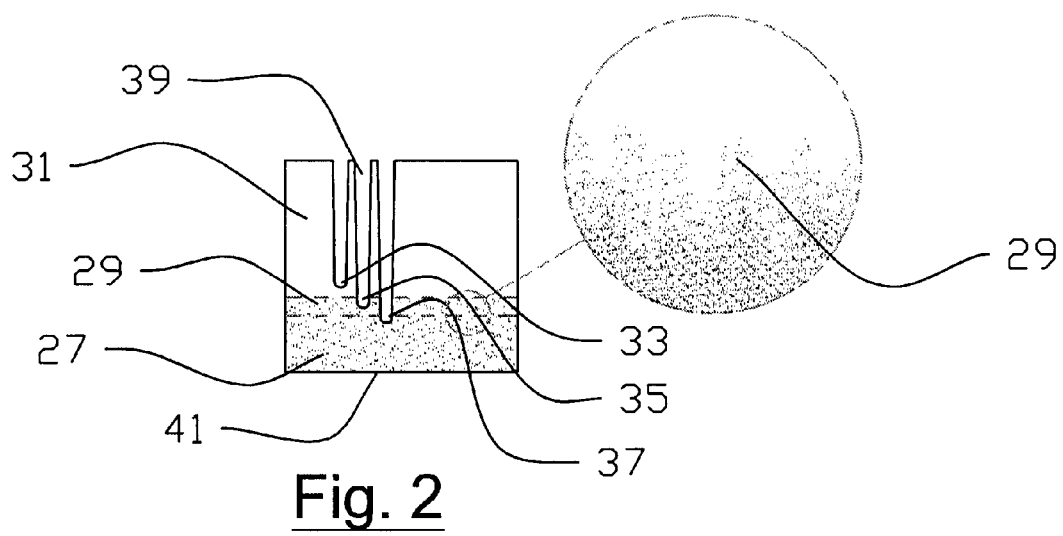
FIG. 2 is a diagram of selected aspects of a module of the present invention depicting the transitional zone between the integrally bonded buffer element and the fins.

An objective of this invention is to present a cooling module having high thermal transfer capability. Another object of this invention is to present a module that can be bonded directly to the heat producing semiconductor device, thereby providing a direct thermal path between the heat producing device and a circulating cooling fluid in an actively cooled thermal management system. These objectives are achieved by using high density micro fins composed of tungsten carbide integrally bonded at high-temperature high-pressure to a polycrystalline diamond buffer element, and the buffer element being bonded directly to the IC device. Polycrystalline diamond by the high-temperature high-pressure sintering method has high thermal conductivity and a coefficient of thermal expansion compatible with the IC device as well as the tungsten carbide fins so that polycrystalline diamond may act as a buffer element between the device and the micro fins. The polycrystalline diamond buffer element may be provided with a metalized surface so that it can be bonded directly to the device in such a fashion that the integrity of the device and the bond will not be compromised as the device is thermally cycled. The tungsten carbide micro fins are also thermally conductive and provide a high surface area for efficient convention into a circulating cooling fluid. The rigidity and toughness of the carbide also enables the fins to be made ultra thin and capable of withstanding the thermal dynamics of the IC device.

Since its introduction over 3 decades ago, polycrystalline diamond by the high-temperature high-pressure sintering method has become the most economical and versatile form of diamond for use in industrial applications. Polycrystalline diamond by the high-temperature high-pressure sintering method has been used primarily in wear resistant applications, such as tooling inserts for cutting non-ferrous materials, rock bits for drilling subterranean formations, and in bearing applications. Since polycrystalline diamond exhibits the high thermal conductivity of its diamond constituent, the applicants have found that it may also be used in thermal management systems.

Generally, polycrystalline diamond by the high-temperature high-pressure sintering method is a composite material comprising diamond and one or more refractory catalyst metals. The method of producing polycrystalline diamond is known in the art and consists of cleaning fine diamond powders by a reduction process in order to remove oxides that might interfere with the reaction. The process requires natural or man-made diamond, and the grain size and shape of the diamond crystals may be varied as a means of increasing the thermal conductivity of the resulting mass. The next step is to mix the diamond powders with a catalyst metal, such as iron, cobalt, or nickel, cobalt being preferred, and then packing the mixture into a refractory metal container. A cemented metal carbide substrate is then positioned adjacent the mixture, and then the substrate and diamond mixture are sealed from contamination that might occur during the sintering process. The interfacial surface of the substrate may be formed in order to mold a desired shape in the opposing surface of the diamond mass. A non-planar interfacial surface has been shown to relieve stresses that build up between the diamond and the substrate due to the differences in linear expansion of the materials. The sealed container is then placed into a high-temperature high-pressure press apparatus, and the diamond mixture is subjected to conditions under which diamond is thermodynamically stable. The sintering process may take a period of time ranging from about 1 to 30 minutes, depending on the composition of the mixture and the style of press apparatus employed. During the sintering process the catalyst materials melt and intimate bonding, or intergrowth, occurs between the diamond crystals to form a unitary mass of diamond. A chemical bond also occurs between the diamond mass and the carbide substrate. Since the metal catalyst remains at interstitial sites within the diamond matrix, it is known in the art to add other materials to the diamond matrix in order to achieve a sintered product designed for a specific use. Such corrosion resistant materials as nickel and chromium have been used in the admixture in order to provide a cobalt alloy resistant to corrosion. Because the discrete diamond crystals are intergrown within the matrix of polycrystalline diamond, a highly conductive thermal path is created through the mass, which also exhibits diamond's low coefficient of thermal expansion. These properties make polycrystalline diamond ideally suited for a cooling module.

Cemented tungsten carbide is also ideally suited for a cooling module since it also has high thermal conductivity, low coefficient of thermal expansion, and especially because of its toughness. Like the diamond grains used in the polycrystalline diamond, the grain size of carbide crystals and the cobalt content may be varied in order to optimize the carbide element for thermal transfer.

The various aspects of the present invention will be described further in reference to the following drawings. These drawings are submitted for illustration purposes and are not by way of limitation, and those skilled in the art will immediately recognize other applications, including alterations and modifications, which appertain to the purposes stated for this invention. Such applications, alterations, and modifications are intended to be included in this disclosure.

Figure 1:
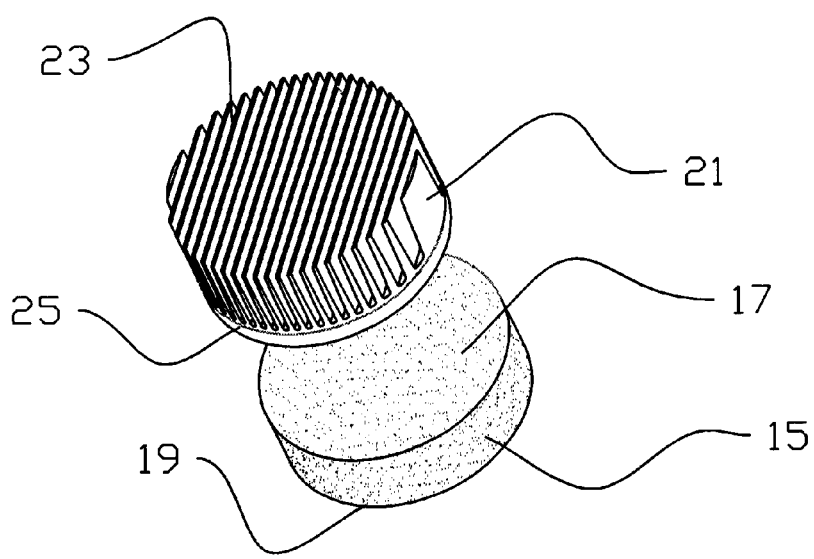
FIG. 1 is a perspective view of a thermal module of the present invention depicting the polycrystalline diamond buffer element and the tungsten carbide fins.

FIG. 1 depicts a cooling module of the present invention comprising a mass of polycrystalline diamond 15 and tungsten carbide fins 21. The diamond matrix 15 has an interfacial surface 17 that matches the interfacial surface of the carbide fins 25. These two surfaces may be attached mechanically or bonded together using a low melting braze, such as indium, or a thermal adhesive. Since diamond is chemically inert, a precursor metal such as gold, silver, platinum, or tungsten may be applied to the surface of the diamond matrix prior to bonding to the fins. Due to the toughness of the carbide, the fins 23 may be made very thin, between 0.010 and 0.070 inches thick. These micro fins present a highly convective cooling surface that is essential for handling high heat densities having a surface area at least 20 times greater, and preferably 60 times greater, than the interfacial surface area of the polycrystalline diamond matrix. The high density micro fins permit efficient cooling within the physical confines of the integrated circuit device, thereby saving costs, space, and weight. The refractory properties of the tungsten carbide resist thermal expansion during thermal cycling of the IC device. In some applications, it may be desirable to mount the fins directly onto the IC device. However, it is more preferable to use the polycrystalline diamond as a buffer element between the heat producing device and the fins because the polycrystalline diamond matrix is more thermally compatible with both the IC device and the fins. Moreover, the polycrystalline diamond buffer element's high thermal conductivity is capable of drawing heat away from the IC device more effectively in high thermal cycling applications, thus permitting the IC device to run faster. In order to increase surface to surface contact between the buffer element and the IC device, the polycrystalline diamond interfacial surface may be machined flat and polished to remove surface asperity. A smooth flat surface that mates with the surface of an IC device eliminates point contacts that produce air gaps that may act as thermal barriers in a high energy thermal system.

FIG. 2 is a graphical depiction of the carbide fins 39 integrally bonded to the polycrystalline diamond buffer element 27. Under sintering conditions, the metal catalyst present in the cobalt cemented, tungsten carbide substrate sweeps, or infiltrates, into the diamond matrix creating an integral bond 29. The bond features a transitional zone of cobalt and diamond. The applicants have found that this transitional layer has desirable thermal properties. First of all, it presents a low thermal impedance transition between the diamond and the carbide. Second, it promotes matching of the thermal properties of the diamond to that of the carbide so that during thermal cycling, stresses between the diamond and the carbide are reduced. Finally, it permits the fins 39 to extend through the carbide 33, or into the transitional zone 35, or even into the diamond matrix 37, in order to achieve greater thermal transfer. The fins 39 may be formed into the tungsten carbide substrate 31 by means of machining, sawing, EDM, laser, etching, or molding. The transitional bond 29 formed in situ during the high-temperature high-pressure sintering process overcomes contact surface resistance that is normally present multi-junction thermal systems and provides a direct path between the heat producing IC device and the convective surface of the fins.

The sweep phenomenon associated with the sintering process may be optimized further in this thermal application. A low melting precursor metal, or metal alloy of copper, may be added to the diamond/catalyst mixture prior to sintering so that during the sintering process the metal melts prior to the melting of the catalyst, and precursor metal is swept ahead of the catalyst through the diamond matrix. The precursor metal will then pool on the outside surface 41 of the buffer element and may be machined to match the surface of the IC device. The metal rich interfacial surface 41 may then be intimately bonded directly to IC device using a low melting braze such as indium or an alloy thereof This intimate bond presents a low impedance surface to surface contact between the IC device and the polycrystalline diamond buffer element completing the thermal path between the device and the convective fins. Thus, the numerous thermal junctions and point contact interfaces present in prior art systems are avoided.

Figure 3:
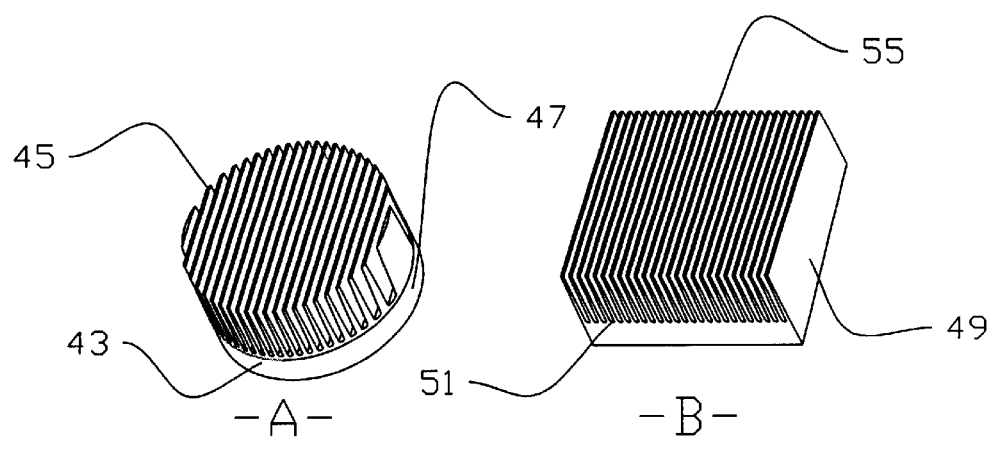
FIG. 3 is a diagram of two thermal modules of the present invention depicting cylindrical and prismatic configurations.

FIG. 3 presents perspective views of cooling modules according to the present invention. Diagram 3A depicts a cylindrical module having micro fins 45 are integrally bonded to a polycrystalline diamond buffer 43 having an interfacial surface 47 adapted for attachment directly to an IC device. The use of the micro fins produces an extremely high surface area for active convective cooling, and the integral bond provides a direct path between the circulating cooling fluid and the IC device. Also, the use of high density fins allows the cooling module to be substantially the same diameter as the IC device, saving, cost, weight, and space in the thermal management system. Diagram 3B depicts a prismatic module 49 having a polycrystalline diamond buffer 51 integrally bonded to tungsten carbide micro fins 55. In many applications, the IC device presents an interfacial surface having a square or rectangular cross section. The prismatic design accommodates such applications with even greater convective cooling area. Although not shown, the height of the fins may be varied in order to concentrate cooling efficiency at or near the locations of the highest thermal activity. Typically, the IC device will be the hottest at or near its center and the fins could be highest in these locations and shorter around the periphery of the module. Furthermore, by varying the geometry of the fins, increased turbulence may be created in the cooling fluid for added convective efficiency. Interfacial surface 53 may be provided with a metalized surface either by coating it with a low melting metal or by the sweep through process described herein. The metalized surface may then be economically machined flat and polished to remove surface asperity in order to achieve the high surface to surface contact required for efficient transfer of thermal energy.

Figure 4:
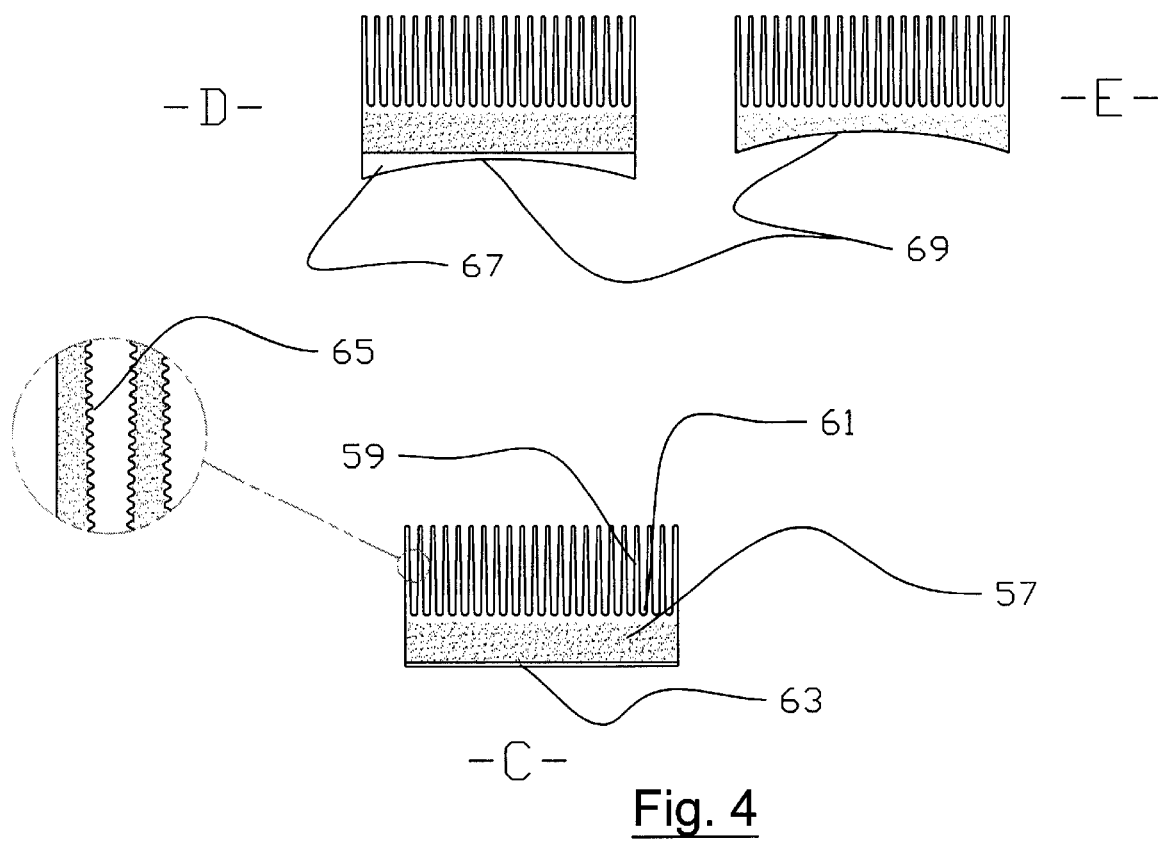
FIG. 4 is a diagram of different aspects of a module of the present invention fin having a roughened surface and non-planar interfacial surfaces.

FIG. 4 is a diagrammatic view of modules of the present invention. Diagram 4C is a module having a polycrystalline diamond buffer 57 element integrally bonded at high-temperature high-pressure to tungsten carbide micro fins 59 that are formed to reach into the transition zone 61 between the carbide and diamond. This design allows the cooling fluid to contact the polycrystalline diamond enhancing the cooling efficiency of the module. A metalized layer 63 is also depicted at the interfacial surface of the cooling module for attachment to the IC device. Blowup 65 of the fins 59 shows the roughened surface of the fins after machining, EDM, or wire sawing. The roughened surface may be advantageous to thermal management in that it increases the convective surface area of the fins and promotes turbulence of the cooling fluid at the convective interface. It has been shown that laminar flow across the fins may actually become a thermal barrier, reducing the efficiency of the micro fin design. Diagram 4D presents another aspect of diagram 4C where it is desired that the metalized surface have a non-planar cross section. Diagram 4E is another variation of diagram 4C wherein the interfacial surface 69 in non-planar, but it does not have the metalized surface and may be mechanically attached to the IC device.

Figure 5:
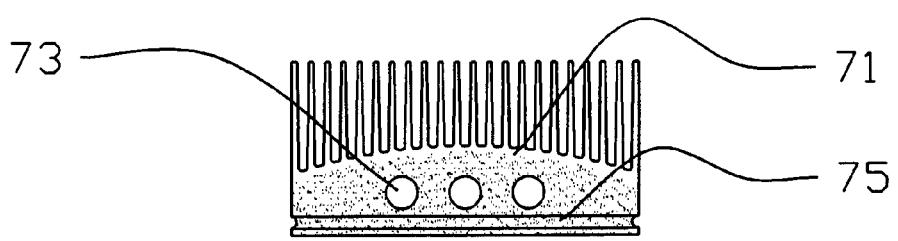
FIG. 5 is a diagram of a module of the present invention having cooling channels through the polycrystalline diamond buffer element and featuring a circumferential groove for sealing the cooling inside the fins.

FIG. 5 presents a diagram of another aspect of the present invention wherein the cooling module 71 features through channels 73 for increased convection. The module also is configured with a circumferential groove, or seal gland, 75 as a means for sealing in a circulating cooling fluid. The through channels may be formed into the polycrystalline diamond buffer element by positioning silicon carbide or other hard metal rods in the diamond matrix prior to sintering. After the high-temperature high-pressure process, the rods may be chemically dissolved leaving the through channels. This process will not adversely affect the integrity of the diamond matrix and may have the added benefit of reducing the overall metal content in the matrix. Another method of producing the channels would be to plunge EDM the channels through the matrix.

Figure 6:
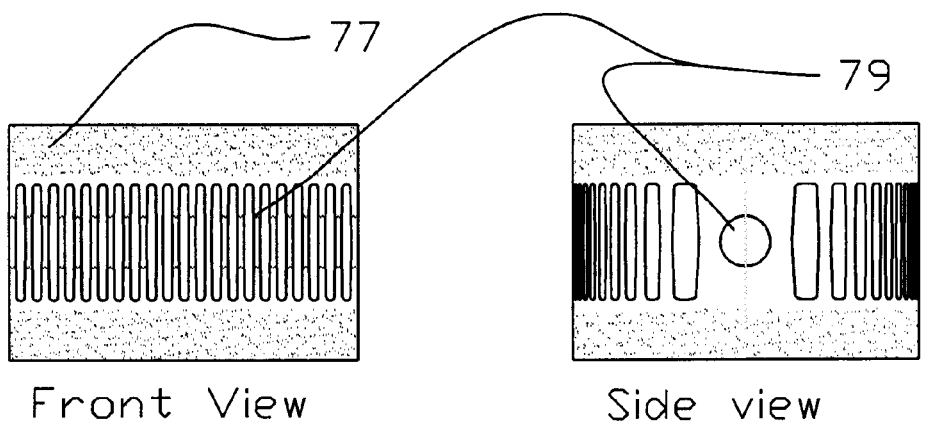
FIG. 6 is a diagram of different fin configurations suitable for a module of the present invention featuring the diamond buffer element on both sides of the fins.

FIG. 6 is a diagram of another embodiment of the present invention depicting two views of a module 77 having two polycrystalline diamond buffer elements joined by micro fins 81. A cooling channel 79 has been formed through the fins in order to increase the convective capacity of the module. This design would allow an IC device to be mounted on each side of the convective fins. The channel through the fins would increase the surface area and promote turbulence across the fins. The micro fins could be formed by plunge EDM or preformed into the tungsten carbide substrate prior to the sintering process.

Figure 7:
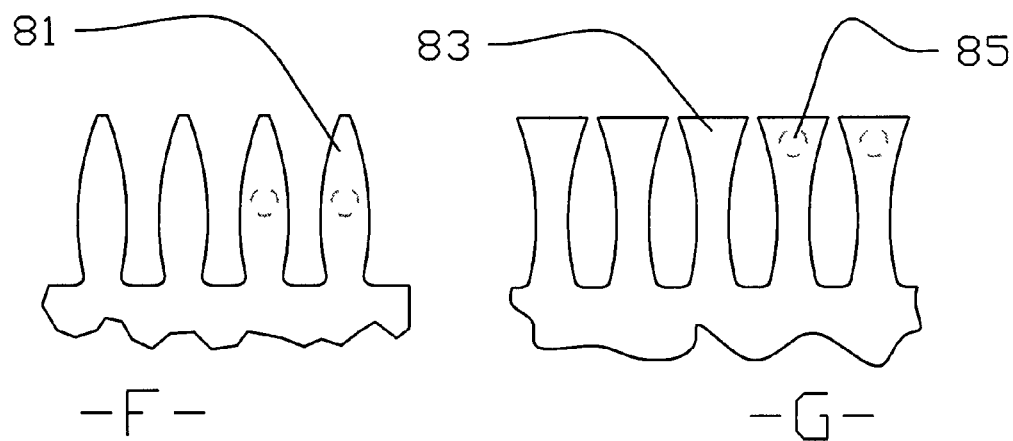
FIG. 7 is a diagram of convex and concave fin configurations.

FIG. 7 is a diagram of micro fin configurations. Diagram 7F depicts fins 81 having convex surfaces for increased surface area and strength. Diagram 7G depicts fins 83 having concave surfaces also for increased surface area and strength. Fins of this type may permit the inclusion of cooling channels 85 for enhanced cooling. Non-planar fins would tend to increase turbulence across the fins thereby increasing the convective efficiency of the cooling module.

Figure 8:
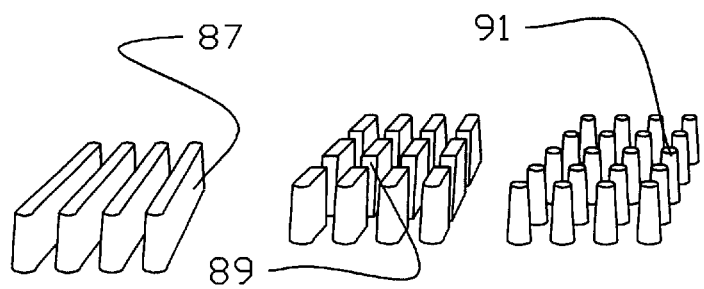
FIG. 8 is a diagram depicting fins of varying configurations of the present invention.

FIG. 8 is a perspective view of fin configurations that are adaptable to the cooling module of this invention. Diagram 8H depicts elongated fins 85 arranged parallel to one another. Diagram 8J depicts fins 87 that have been formed by dividing the fins at right angles. This cross-hatch configuration increases the flow of cooling fluid across the fins and increased the amount of turbulence at the convective interface of each fin. Diagram 8K depicts pin fins 91. These fins too enhance cooling efficiency by increasing the turbulence of the cooling fluid at the pin interface.

Figure 9:
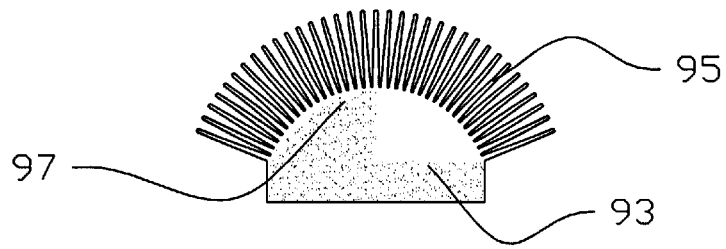
FIG. 9 is a perspective diagram of a finned carbide body and a polycrystalline diamond buffet element.

FIG. 9 is a diagram of another embodiment of the present invention wherein the polycrystalline diamond buffer element 93 has been formed into a hemisphere, or dome 97 having micro fins 95 arrayed about its surface. A benefit from this design is that the volume of polycrystalline diamond has been increase so that thermal energy is rapidly conducted a longer distance away from the IC device into an even greater number of micro fins. In applications where the hottest portion of the IC device is in the center of the device, this design optimizes the high conductivity of the polycrystalline diamond by positioning its greatest cross section over the area of highest thermal activity. This non-traditional fin configuration is made possible because of the integral strength of the tungsten carbide, which allows it to be formed into very fine shapes and yet retain its rigidity. The tungsten carbide is capable of withstanding the thermal cycling as well as the high flow of the cooling fluid.

Figure 10:
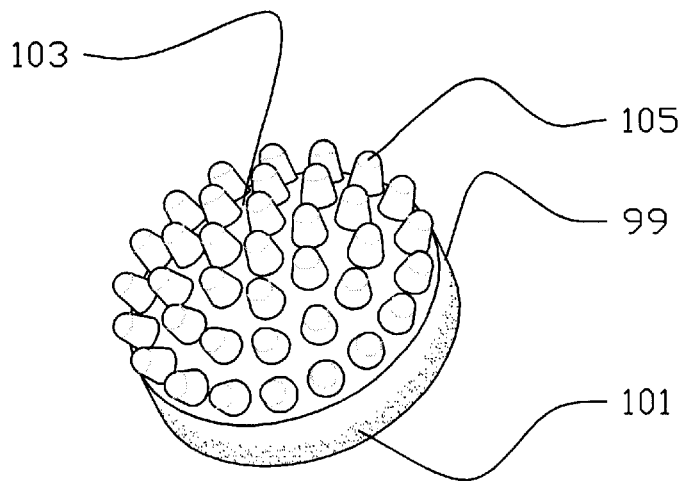
FIG. 10 is a perspective diagram of a pin finned carbide body bonded to a polycrystalline diamond buffer element.

FIG. 10 is another perspective view of an embodiment of the present invention. Module 99 has a polycrystalline diamond buffer element 101 integrally bonded to a tungsten carbide substrate having a convex major surface 103. Pin fins 105 are arrayed about the convex surface in order to optimize the increased surface area. Pin fins 105 are near conical in shape for added strength and durability. The pin fins 105 may be spaced apart in order to allow a high volume of cooling to contact the major surface of the substrate. The pin fins interrupt the laminar flow of the cooling fluid, increasing turbulence and thereby increasing the convective efficiency of the cooling fluid.

What is claimed is:

1. A heat dissipating module, comprising:
   a. a tungsten carbide element comprising a first surface having a plurality of fins and a second surface opposing the first surface suitable for bonding to a buffer element;
   b. the buffer element consisting of polycrystalline diamond, produced by the high-pressure high-temperature method, having a first surface complimentary with the second surface of the carbide element, said first and second surfaces being bonded together at high pressure and high temperature, and the buffer element further comprising a second non-planar surface adapted for attachment to a heat producing integrated circuit device.

2. The heat dissipating module of claim 1, wherein at least a portion of the fins are actively cooled by a circulating cooling fluid.

3. The heat dissipating module of claim 1, wherein at least a portion of the fins are passively cooled.

4. The heat dissipating module of claim 1, wherein the buffer element has a diameter substantially equivalent to the diameter of the integrated circuit device.

5. The heat dissipating module of claim 1, wherein the fins are formed into the tungsten carbide element by molding, machining, plunge or wire EDM processing, wire sawing, or by chemical etching.

6. The heat dissipating module of claim 1, wherein the tungsten carbide element is composed of a binder consisting of cobalt, iron, or nickel, or an alloy thereof, and a corrosion resistant material comprising chromium or an alloy thereof.

7. The heat dissipating module of claim 1, wherein the interfacial surface is adapted for attachment to the integrated circuit device by means of a mechanical or chemical bond.

8. The heat dissipating module of claim 1, wherein the interfacial surface is coated with a low melting point metal, or alloy thereof, as a means of bonding the module to the heat producing device.

9. The heat dissipating module of claim 1, wherein the interfacial surface comprises a low melting metal, or alloy thereof, as a means of bonding the module to the heat producing device.

10. The heat dissipating module of claim 1, wherein the width of the fins is between 0.010 and 0.070 inches.

11. The heat dissipating module of claim 1, wherein the ratio of the convective surface area of the fins to the surface area of the interface is at least 20:1.

12. The heat dissipating module of claim 1, wherein the fins are of varying heights.

13. The heat dissipating module of claim 1, wherein the surfaces of the fins are non-planar, having a concave, convex, or interrupted topography.

14. The heat dissipating module of claim 1, wherein one or more channels are provided through the carbide element, the buffer element, or the fins, or a combination thereof.

* * * * *